(12) United States Patent
Barath et al.

(10) Patent No.: US 7,783,055 B2
(45) Date of Patent: Aug. 24, 2010

(54) SOUNDPROOF CLIMATE CONTROLLED RACK

(75) Inventors: Yossi Barath, Herzelia (IL); Michael Surov, Tel Aviv (IL); Alon Slapak, St. Mazor (IL); Itai Michael Itnati, Ramat Gan (IL)

(73) Assignee: Silentium Ltd., Rehovot (IL)

( * ) Notice: Subject to any disclaimer, the term of this patent is extended or adjusted under 35 U.S.C. 154(b) by 429 days.

(21) Appl. No.: 11/606,019

(22) Filed: Nov. 30, 2006

(65) Prior Publication Data

US 2007/0110255 A1    May 17, 2007

Related U.S. Application Data

(63) Continuation-in-part of application No. 10/573,060, filed on Mar. 20, 2006, and a continuation-in-part of application No. 10/262,838, filed on Oct. 3, 2002, now abandoned, and a continuation-in-part of application No. 09/120,973, filed on Jul. 22, 1998, now Pat. No. 7,317,801.

(60) Provisional application No. 60/778,091, filed on Mar. 2, 2006, provisional application No. 60/778,090, filed on Mar. 2, 2006.

(51) Int. Cl.
*A61F 11/06* (2006.01)
*G10K 11/16* (2006.01)
*H03B 29/00* (2006.01)

(52) U.S. Cl. ............. 381/71.3; 381/71.5; 381/71.8

(58) Field of Classification Search .......... 181/206; 381/71.1, 71.3, 71.5, 71.8, 71.9, 71.13, 71.14, 381/66, 94.1–94.3, 94.7; 379/406.01, 406.05, 379/406.08
See application file for complete search history.

(56) References Cited

U.S. PATENT DOCUMENTS

| 2,091,774 | A | * | 8/1937 | Weiland | ........... 181/200 |
| 4,665,549 | A | * | 5/1987 | Eriksson et al. | ........... 381/71.5 |

(Continued)

FOREIGN PATENT DOCUMENTS

EP    1414021 A1 *  4/2004

(Continued)

OTHER PUBLICATIONS www.worksafe.wa.gov.au/newsite/worksafe/default.html.

(Continued)

*Primary Examiner*—Xu Mei
(74) *Attorney, Agent, or Firm*—Shiloh et al.

(57) ABSTRACT

Soundproofing a rack by installing at least one duct on at least one panel of the rack, or as part of the side panels of the rack, or is mounted inside the rack as a drawer in such a way that air can flow outside from the rack causing air to flow from the rack through the duct, and providing an active noise control (ANC) system within the duct. Passive noise control may also be provided in the duct. At least one fan may be provided at an inlet of the duct. Fan speed may be controlled, in response to a climactic condition within the rack. The duct may comprise a back panel which is added on or a replacement for an existing back panel of the rack. A muffled inlet may be provided on another external surface of the rack.

18 Claims, 7 Drawing Sheets

U.S. PATENT DOCUMENTS

| | | | |
|---|---|---|---|
| 5,377,275 A | | 12/1994 | Suzuki |
| 5,511,127 A | * | 4/1996 | Warnaka .................... 381/71.5 |
| 5,606,622 A | | 2/1997 | Christenson |
| 6,891,347 B2 | * | 5/2005 | Dobbs et al. ................. 318/471 |
| 7,161,801 B2 | * | 1/2007 | Chen et al. .................. 361/690 |
| 7,167,363 B1 | * | 1/2007 | Cushman et al. ............ 361/694 |
| 7,353,908 B1 | * | 4/2008 | French ..................... 381/71.5 |
| 2003/0107873 A1 | * | 6/2003 | Van Gaal ................... 361/690 |
| 2003/0123675 A1 | * | 7/2003 | Culman et al. ............. 381/71.1 |

FOREIGN PATENT DOCUMENTS

WO    WO 2005/027338    3/2005

OTHER PUBLICATIONS http:\\en.wikibooks.org/wiki/Acoustics/Noise_from_Cooling_Fans.

* cited by examiner

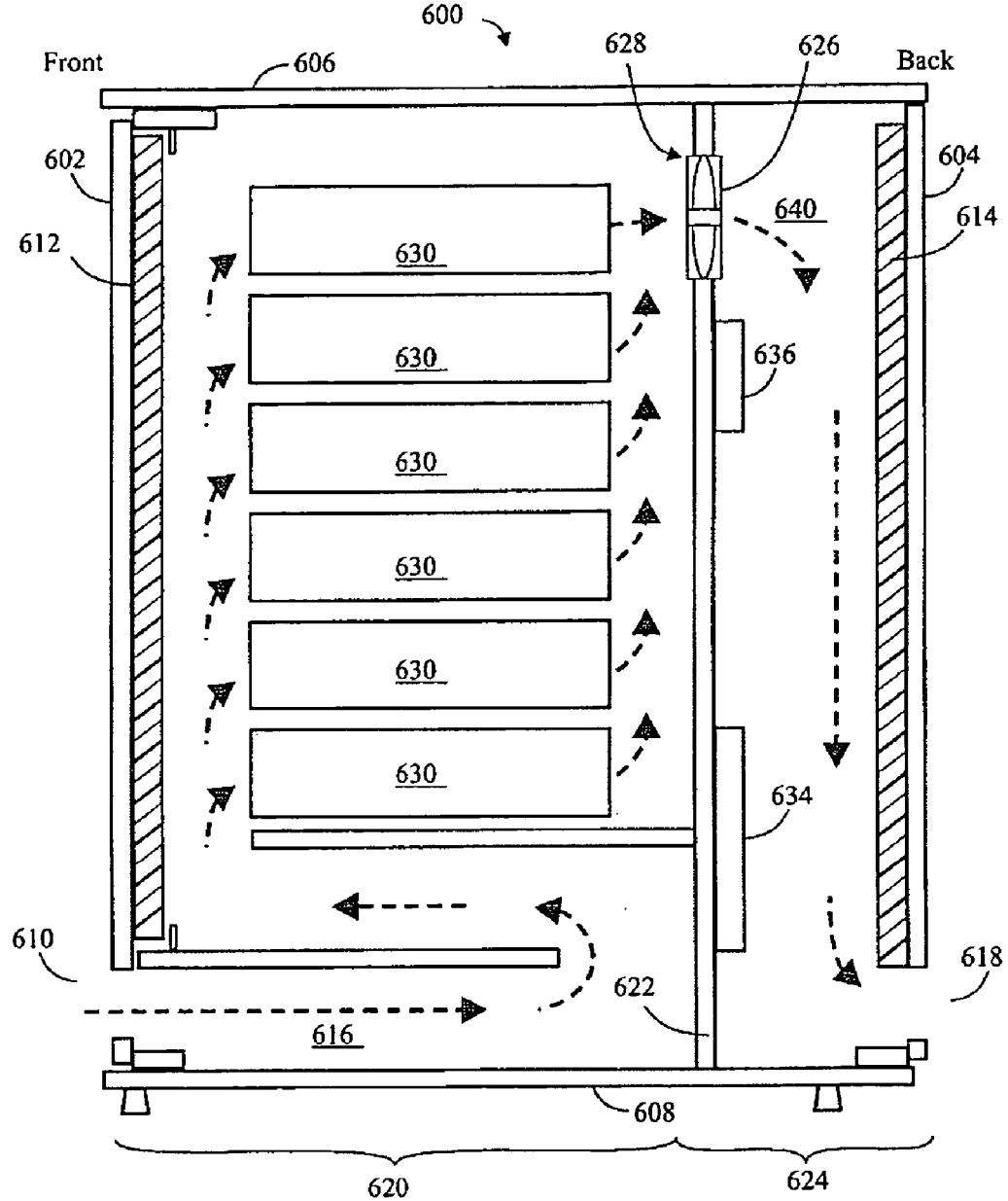

SOUNDPROOF CLIMATE CONTROLLED RACK

CROSS-REFERENCE TO RELATED APPLICATIONS

This is a non-provisional filing of U.S. Provisional No. 60/778,091 filed 2 Mar. 2006, incorporated in its entirety by reference herein.

This is a non-provisional filing of U.S. Provisional No. 60/778,090 filed 2 Mar. 2006, incorporated in its entirety by reference herein.

Cross-reference is made to commonly-owned, co-pending U.S. patent application Ser. No. 11/606,010, entitled "Quiet Active Fan For Servers Chassis", filed Nov. 30, 2006.

This is a continuation-in-part of U.S. Ser. No. 09/120,973, filed Jul. 22 1998 now U.S. Pat. No. 7,317,801 and a continuation-in-part of U.S. Ser. No. 10/262,838, filed on Oct. 3, 2002 now abandoned and a continuation-in-part of U.S. Ser. No. 10/573,060, filed Mar. 20, 2006.

TECHNICAL FIELD

The disclosure relates to cabinets (racks) for mounting electronic equipment (referred to herein as "blade chassis") and, more particularly, to reducing and controlling noise generated within a blade chassis.

BACKGROUND

Rack-Mounting Servers

Servers and similar electronic devices, such as data storage devices, may be deployed in two different manners, the traditional tower server chassis, or a rack-mountable chassis. For years tower servers were the standard, but over the past few years, rack-mounting servers has become very popular because it allows for increased manageability, consolidation, security, expansion and modularity, helping to lower the cost of deploying servers.

Some believe that "rack-mounting" (or "rack-mounted", or "rack-mount") servers are something that only makes sense for the largest companies, with mainframes and huge "glass house" data centers. In reality, anyone may take advantage of rack-mounting servers and gain their benefits.

Equivalently, data storage "farms" such as RAID (Redundant Arrays of Independent Disks, or Drives) disk storage racks have similar or equivalent issues, as will other heat-producing electrical devices, such as massively parallel unit (such as hypercube) and the like.

Racks are typically measured in rack units or "U's"; each U is 1.75" high. Among the most popular racks are available in two heights—a 24 U short rack and a 42 U full rack. Computer companies offer a variety of servers to be mounted inside the racks in sizes varying from 1 U through 5 U. Among the most popular being the rack-dense 1 U and 2 U servers.

FIG. 1 illustrates a 42 U (forty-two unit) rack equipped with rack-mounting servers, and is exemplary of the prior art. The rack is shown with its front door open, revealing a plurality of rack-mounted servers inside.

FIG. 2 illustrates a 24 U (twenty-four unit) short rack and a 42 U full rack, and is exemplary of the prior art. Both of the racks are illustrated with their front doors closed.

Thermal Concerns

The primary reason for the growth of the rack-mounting servers market is that data center space is either scarce, expensive, or both for many organizations; so whether customers build their own data centers or lease space from a service provider, users must maximize their return by deploying as many servers as possible in the smallest space possible.

These factors have made 1 U and 2 U servers particularly attractive. Moving forward, servers will get even denser with the advent of Server Blades and Modular Blades. With this increased density, however, comes increasing power and thermal concerns as data center managers struggle with the ability to power and cool these rack-dense configurations.

As used herein, the term "Blade server" refers to a self-contained computer server, designed for high density. A blade server is a server chassis housing multiple thin, modular electronic circuit boards, known as server blades or a modular blades.

As used herein, the term "modular blades" refers to a thin, modular electronic circuit board containing one, two, or more microprocessors and memory, that is intended for a single, dedicated application (such as serving Web pages) and that can be easily inserted into a blade server.

The ultimate temperatures seen by internal server components will vary from server to server depending on the configuration, application, position in the rack, position in the data center, the amount of cabling, etc. Modern servers are typically designed to cool from front to back and are tested to meet elevated temperatures exceeding what is commonly found even in the worst-case locations in a data center. Conventional servers are designed for a 35° C. (95° F.) inlet temperature (into the front server surface) at maximum component power dissipations. This means that when run at full load, internal components are maintained below their recommended guidelines, or below the more stringent guidelines imposed by the manufacturer.

In a redundantly cooled system, the components meet these temperature requirements even in the event of a fan failure. With processors, servers are usually designed to cool to meet the requirements of future processor speeds, up to the maximum speed expected (based on, for example, the manufacturer's specification). Thus, for a server component to exceed allowable operating temperatures, the server must be operating at maximum power (a maximized application, maximum processor speed) in an environment exceeding 35° C. (95° F.). Since many data centers are cooled to the low 20° C. (68° F.) range, there should be significant margin.

Traditional data center racks cool from the bottom up, taking in cool air that was being pumped into the data center through the raised floor. Other servers are designed to cool front to back, allowing them to be used in any environment. What often matters for racks' thermal concerns is that there is adequate air flow for cooling. The rack doors are usually perforated to allow for air flow, helping to cool such systems.

High-density servers often have reduced system airflow due to the added impact (for example convection and/or conduction) of the rack, cables, and cable management arm(s). Factors for system-reduced airflow include the following:
  Blockage due to cable management arms
  Blockage due to cables
  Rack doors, internal partitions and conduits

Conservative Thermal Solution

Relying on airflow for cooling the dense servers, and obliging the use of active devices to produce enough air movement (such as, lengthwise of the electronic cards) and particularly around the processors, hard-drives, power devices, and so forth, can be problematic. These active devices are in many of the cases fans or blowers, which differ only by their blade(s) configuration. The fans or the blower may be mounted anywhere in the dense server, but should obey several thermal guidelines to produce an efficient airflow around any important device(s) in the unit(s).

FIG. 3 illustrates a 1 U dense server (for rack-mounting) with a cooling blower at the middle of the unit, and is exemplary of the prior art.

Normally, modern rack(s) mounting servers' fans/blowers are designed to produce a front to back cooling airflow. This is very effective when several similar dense servers are mounted together in a single dedicated chassis. The chassis, which may then be installed in a rack, prevents air from streaming to any direction besides from the front panel to the back panel.

FIG. 4 illustrates a 4 U chassis with front to back cooling airflow, as is exemplary of the prior art.

A great deal of rack-mount equipment is designed with fans/blowers placed in front and back; likewise, many rack enclosures are designed for a front-to-back airflow. The heat dissipation resulting from the interior equipment fans (or blowers, see FIG. 3) is generally insufficient for coping with amount of heat produced by modern servers. This concern involves auxiliary fans to be mounted at the panel of the rack and producing additional pressure to increase heat dissipation capacity.

FIG. 5 illustrates a rack with eight auxiliary fans mounted lengthwise (vertical, as illustrated) on the front door, as is exemplary of the prior art.

Noise Concerns

Rack-mount servers (see, for example, FIG. 3) themselves are major noise sources and may produce a noise level of more then 80 dBA, which is regarded as very loud noise. Conservative solutions are based on sealing the rack(s) with barrier materials such as steel, tin, rubber sheets, etc, and/or one or more lining of sound-absorbing materials on the interior side(s) of the rack panels, and quieting the outlets/inlets by installing passive mufflers which are a kind of a metal or plastic or any rigid material maze with absorbing materials glued on its internal walls. This procedure may cause thermal problems by restricting the airflow ability, and preventing efficient heat dissipation. The problem is usually solved by adding auxiliary quiet blowers at the top of the rack or on one of its walls, and arranging a less effective passive muffler at the air inlet. However, quiet blowers are typically accompanied by poor airflow capacity, and acoustic mufflers are designed to block noise by turning the air through different angles (directions) and hence reducing its velocity. The muffler operation results in additional negative impact to the airflow capacity.

Racks with the muffler/quiet fans solution may cope with heat amount of up to 5 kW and with noise reduction of up to 10 dBA.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

ANC Short for active noise control. ANC is achieved by introducing a canceling "antinoise" wave through an appropriate array of secondary sources. These secondary sources are interconnected through an electronic system using a specific signal processing algorithm for the particular cancellation scheme. ANC is an effective way to attenuate noise that is very difficult and expensive to control using passive means. It has application to a wide variety of problems in manufacturing, industrial operations, and consumer products. See, for example U.S. Pat. No. 5,377,275, incorporated by reference herein in its entirety.

dB Short for decibel. The decibel (dB) is a measure of the ratio between two quantities, and is used in a wide variety of measurements in acoustics, physics and electronics. While originally only used for power and intensity ratios, it has come to be used more generally in engineering. The decibel is widely used in measurements of the loudness of sound. The decibel unit is commonly used in acoustics to quantify sound levels relative to some 0 dB reference.

dBA Short for decibels adjusted. Weighted absolute noise power, calculated in dB referenced to 3.16 picowatts (−85 dBm), which is 0 dBA.

RAID Short for Redundant Array of Independent Disks. The basic concept underlying RAID is that spreading or "striping" data across multiple hard drives provides three benefits over a large single hard drive: redundancy, higher performance, and greater (and easier) scalability. These benefits are particularly compelling in the server environment, where downtime is very expensive, drive subsystem performance is critical to good server performance, and adding storage capacity is often required. The set of disks across which the data is striped is referred to as an array. The RAID controller hides the individual drives and all the striping and redundancy from the rest of the system. It 'fakes' the system and OS into seeing what looks like a single large drive, which in fact is composed of multiple physical hard drives. RAID controllers can support the creation of multiple composite drives. If one disk fails, the system keeps running by accessing the redundant data on the other disk drives. The failed drive can be removed and replaced ("hot plugged") and the new disk drive is automatically reconstructed by using the information on the remaining drives in the RAID group. All of this can be done without any host, operator, or operating system involvement.

Server A computer on a network that recognizes and responds to client requests for services such as file and print requests or that supports more complex business applications.

Server Blade Built to slide into existing servers, a server blade is a circuit board that contains components on multiple boards.

Modular Modular refers to a system design that is made up of separate components that can be connected. In a modular design, different components may be added or replaced without affecting the rest of the components in the system.

UPS Abbreviation for Uninterruptible Power Supply (UPS). UPSs use generators and/or batteries to power themselves, keeping them operating during power outages and helping to prevent loss of service for mission critical applications.

BRIEF DESCRIPTION (SUMMARY)

According to the disclosure, a method of soundproofing a rack comprises: installing at least one duct on at least one panel of the rack or in a contact with at least one panel causing air to flow outside from the rack through the duct; and providing an active noise control (ANC) system at least partially within the duct. Passive noise control may also be provided in the duct. At least one fan may be provided at an inlet of the duct. Fan speed may be controlled, in response to a climactic condition within the rack. The duct may comprise a back panel which is added on or a replacement for an existing back panel of the rack.

According to the disclosure, a soundproof, climate-controlled rack comprises: a duct mounted to an external surface of the rack or is part of the side panels of the rack (for example, two ducts as part of the front panel for air inlet and two ducts as part of the back panel for air outlet), or is mounted inside the rack as a drawer with a sort of contact to one or more of the rack panels in such a way that air can flow outside from the rack; means for causing air to flow from the rack through the duct; and an active noise control (ANC) system disposed at least partially in the duct. Also explicitly contemplated is where the ANC may be implemented, added or maintained associated with an inlet and/or an outlet. The external surface may comprise a back panel of the rack. The means for causing air to flow may comprise at least one fan. Means may be provided for controlling a speed of the fan in response to a climactic condition within the rack. A muffled inlet may be provided on another external surface of the rack. The duct may be generally rectangular prismatic shaped having six sides, an inlet opening at one end, and an outlet opening at an opposite end.

BRIEF DESCRIPTION OF THE DRAWINGS

Reference will be made in detail to embodiments of the disclosure, examples of which may be illustrated in the accompanying drawing figures (FIGs.). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale for illustrative clarity. Certain ones of the drawings may be stylized for illustrative clarity. For example, an element which is hidden (such as in a perspective view) may be illustrated with solid lines, rather than dashed lines.

FIG. 6 is a diagram of a rack with an air inlet muffler and soundproof climatic controlled back panel, according to the disclosure.

DETAILED DESCRIPTION

Figure 1:
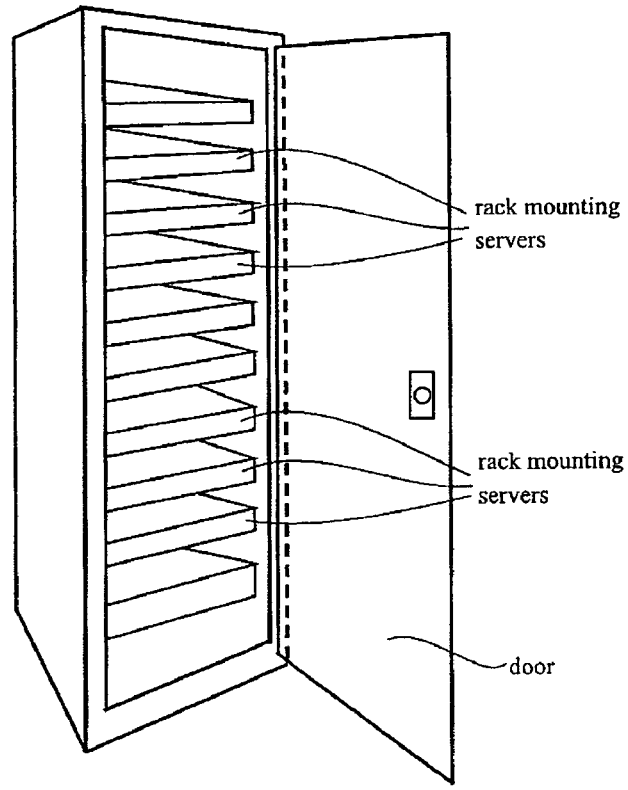
FIG. 1 is a diagram illustrating a 42 U (forty-two unit) rack equipped with rack-mounting servers, according to the prior art.

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

In some embodiments, there is provided a soundproof climatic controlled panel. "Soundproof" may refer to not penetrable by audible sound. "Soundproof" may also refer to partially penetrable by audible sound. Moreover, "Soundproof" may refer to having reduced penetration of audible sound. "Soundproof panel" may refer to a panel (such as a component of a rack) which may be adapted to prevent or reduce the penetration of audible sound such as noise. "Soundproof cooling unit" may refer to a drawer like unit which may be installed in the rack as any other device, basically as the upper device and/or the lower device, which may be adapted to prevent or reduce the penetration of audible sound such as noise.

"Climatic controlled" may refer to having regulated and/or managed effect on climate (for example, temperature, humidity and/or airflow condition). "Climatic controlled panel" may refer to a panel (such as a component of a rack) which may be adapted to control, regulate and/or manage the climate.

The soundproof climatic controlled wall (or panel or cooling unit) may include one or more auxiliary fans or blowers. The one or more auxiliary fans or blowers may provide airflow capacity to cope with heat dissipation which may be measured in some cases as power consumption, of up to 12 kW. Furthermore, the soundproof climatic controlled wall (or panel or cooling unit) may provide a noise reduction of up to 20 dBA or more.

The abbreviation "dBA" may refer to decibels adjusted and may also be referred to as dBm adjusted. The abbreviation "dBA" may refer to weighted absolute noise power, calculated in dB referenced to 3.16 picowatts (−85 dBm (referenced to one milliwatt)).

The soundproof climate controlled panel may replace or augment one or more of the six or more panels of a rack including, but not limited to, one or more door(s), wall(s), floor(s) or roof(s), or may be installed in the rack as any other device, basically as the upper device and/or the lower device, like a drawer with a connection to a one or more inlet/outlet openings in one or more of the six or more panels of a rack.

The installation configuration may be derived from the required airflow regime. Heavy-duty racks may require more than one soundproof climatic controlled panels which may then, for example, be installed at a different direction of the fans and serve as air inlet as well as air outlet.

There is also provided a rack which may include one or more soundproof climatic controlled panel(s). The soundproof climatic controlled wall (panel or cooling unit) may include one or more auxiliary fans or blowers. The one or more auxiliary fans or blowers may provide airflow capacity to cope with heat dissipation of up to 12 kW. Furthermore, the soundproof climatic controlled wall may provide a noise reduction of up to 20 dBA or more.

The panel and/or rack as referred to herein may provide more than 6 kW heat dissipation while 2 blade servers are installed. The rack as referred to herein may provide about 15 dBA reduction of the equipment noise.

The noise reduction may be achieved by at least one or more means of:

Passive noise reduction, for example:
  Quiet structure(s), for example: strengthening to the rack panels, maze like structure of the air inlet, the air outlet and/or the cable(s) openings;
  Absorbing materials, for example: sponges, wool and any other acoustic absorbing compound;
  Isolation materials, for example: stratified structure of the walls and seals;
  Vibrations damping techniques, for example: shock absorbers associated with the fans, elastic hinges and/or elastic feet.

Active noise reduction, for example:
  One or more Acoustic Noise Control (ANC) system (which will be discussed in more detail hereinafter), for example to reduce the fans noise;
  One or more ANC systems to reduce the noise emitted from the air inlet or outlet.

The climate control system may include one or more means of controllable fan operation regarding temperature, pressure, fan failures and humidity. The climate control system may accelerate (increase) or decelerate (decrease) the fan's velocity based on the heat dissipation needs, which may be computed regarding the temperature and the interior pressure. This control may yield a significant power saving, and may also reduce noise which is generated and needs to be suppressed.

In addition, the control system may warn the user when fan fault appear to occur or may occur, hence to prevent damage to the equipment.

FIG. 6 illustrates (in cross-section) an example of a rack (cabinet) 600. To the left of the figure is the front of the rack, having a door 602. To the right of the figure is the back of the rack, having a hinged door 604. The rack 600 has a top wall 606, and a bottom wall 608. The rack 600 has two sides walls, not visible in the cross-section.

Figure 5:
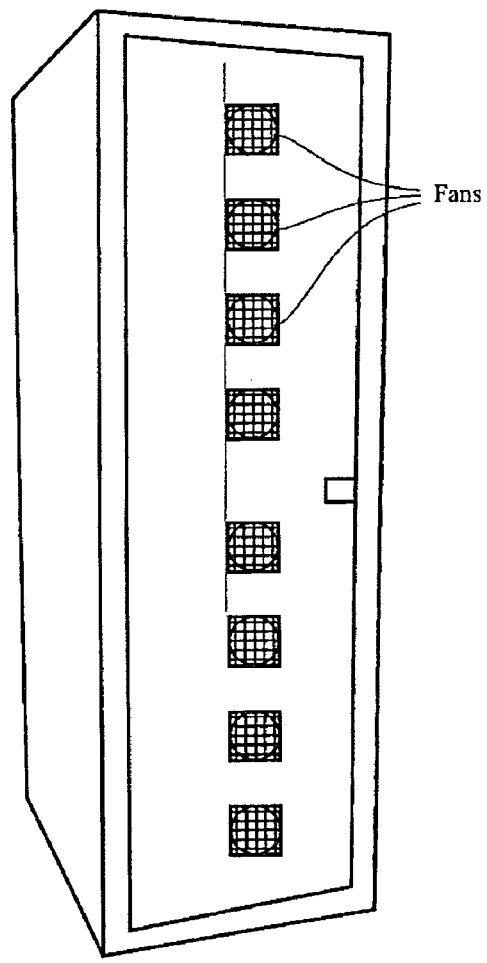
FIG. 5 is a diagram illustrating a rack with eight auxiliary fans mounted lengthwise (vertical, as illustrated) on the front door, according to the prior art.
Figure 4:
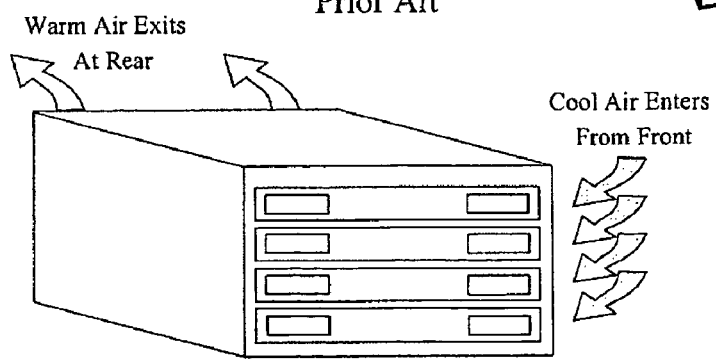
FIG. 4 is a diagram illustrating a four chassis with front to back cooling airflow, according to the prior art.

The rack 600 is generally a six-sided rectangular (prismatic) cabinet structure, such as shown in FIG. 5

There is soundproof material 612 lining the inside surface of the front door 602, and soundproof material 614 lining the inside surface of the back door 604.

The front door 602 has an opening (air inlet) 610 leading to a channel 616 located at a bottom portion of the rack 600, in a front portion 620 of the rack 600. Airflow into the opening 610 and in the channel 616 is indicated by dashed-line arrows. The air inlet 610 may be provided with a muffler (not shown).

A front portion 620 of the rack 600 is separated by an interior wall 622 from a back portion 624 of the rack 600. The interior wall 622 extends from side-to-side, and from top-to-bottom, and is generally what would be the exterior back wall in a conventional prior art rack.

The interior "back" wall 622 is provided with an opening 628 through which air can escape from the front portion 620 of the rack 600. Generally, airflow through the front portion 620 of the rack 600 is from front bottom to rear top. Cooling air enters the channel 616 through the opening 610 in the front door 602. The channel 616 may be labyrinthine (maze like)—that is, first extending towards the back of the rack 600, then turning 180 degrees and extending towards the front of the rack 600, as illustrated. In this manner, cooling air will be available at the front(s) of the server(s) 630 (as if the front door 602 were open). The "maze" of the channel 616 is sometimes referred to as a "muffler".

A number of (six, illustrated) rack-mounted servers 630 are illustrated, mounted in a conventional manner in the front portion 620 of the rack 600. Generally, the entire front portion 620 of the rack 600, up to the interior "back" wall 622, is of conventional design.

A fan 626 may be disposed in the opening 628 to assist in moving air from the front portion 620 of the rack to the back portion 624 of the rack (and, in a typical prior art rack where the wall 622 is the exterior wall, to outside of the rack). The fan 628 is optional.

In this example, the entire back portion 624 of the rack 600 can be considered to be a soundproof, climatic-controlled back panel, rather than simply being a wall with a fan (626) in it.

The soundproof, climatic-controlled back panel 624 may be an add-on to, or a replacement for, the existing back panel (622) of a rack (600). (Without the climactic-controlled back panel 624, the back panel 622 would constitute an external surface of the rack 600.) As mentioned above, any of the panels (walls, external surfaces) of the rack 600 can be modified, as disclosed herein, to be a soundproof climatic controlled panel. The reference numeral "624" will be used to refer to the soundproof, climatic-controlled back panel, described herein. Later, examples will be given where the back panel 624 is a duct, or a plurality of ducts.

The basic unit of the soundproof climatic controlled panel 624 comprises a channel 640 extending from the top of the rack 600 to the bottom of the rack 600, and from the interior back wall 622 of the rack 600 to the back door 604 of the rack 600.

Generally, the soundproof climatic controlled panel 624 may be a duct (other embodiments of ducts are described hereinbelow) which is generally rectangular prismatic shaped having six sides, an inlet opening at one end, and an outlet opening at an opposite end.

Generally, the channel 640 has an inlet opening (628, with optional fan 626) disposed near the top of the rack for receiving equipment-warmed air from the front portion 620 of the rack 600, and has an outlet opening 618 (compare 610) disposed near the bottom of the back door 604 for expelling air from within the rack 600 to without the rack 600.

The soundproof climatic controlled panel 624 may include one or more the following:

Acoustic passive materials, such as the soundproof material 614 lining the inside surface of the back door 604. Acoustic passive material may be used on any/all of the interior surfaces of the channel 640.

Inlet fans, such as the fan 626 disposed in the interior back wall 622 of the rack 600.

An ANC system 634 (described in greater detail hereinbelow), which may be disposed in the channel 640, but which may be disposed elsewhere in the rack 600.

A control system 636 (described in greater detail hereinbelow), which may be disposed in the channel 640, but which may be disposed elsewhere in the rack 600.

The ANC System (634)

Figure 7:
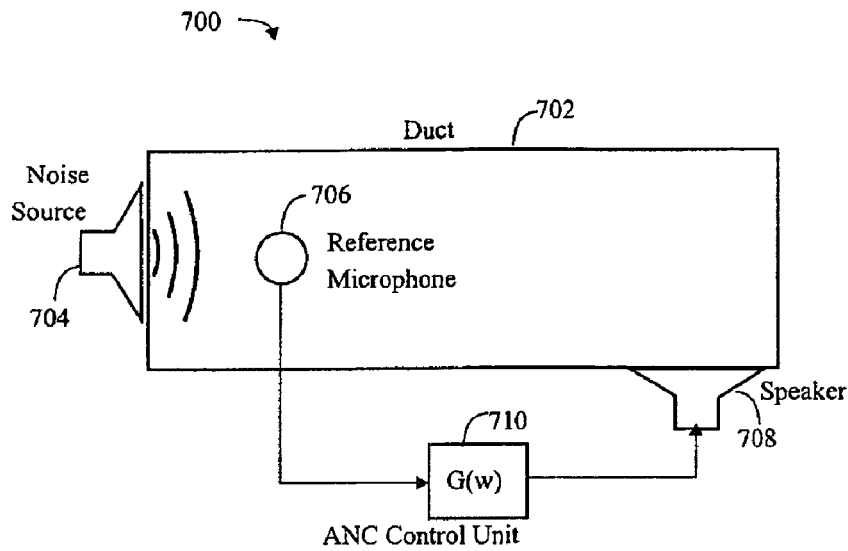
FIG. 7 is a diagram illustrating an ANC system, generally.

FIG. 7 illustrates an active noise control (ANC) system 700, generally. The ANC system 700 is shown in conjunction with an elongate, air duct 702 having an inlet end which is open (to the left of the figure) and an outlet end which is open (to the right of the figure). The air duct may 702 may have a round cross-section, or it may have a rectangular cross-section.

Generally, the purpose of the air duct 702 is to convey air from one location to another, from its inlet end to its outlet end. In the context of the present disclosure, the air duct 702 has an additional purpose which is reducing noise which may be emanating from the one location.

A noise source 704 is shown at the inlet end of the air duct 702.

The ANC system 700 includes an acoustic sensor (input transducer, such as a microphone) 706 that receives the noise to be reduced (destructed, suppressed reduced or cancelled). The acoustic sensor 706 may be referred to herein as "reference microphone". The reference microphone 706 may be located anywhere within the duct 702, and may also be located outside of the duct 702.

The ANC system 700 includes an acoustic transducer (output actuator, such as a speaker) 708 that emits destructive (noise-canceling) noise (also referred to as "anti-noise"). The acoustic transducer 708 may be referred to herein simply as "speaker". The speaker 708 may be located anywhere within the duct 702, and may also be located outside of the duct 702.

The ANC system 700 includes a controller (electronic system) 710 which calculates the destructive (noise-canceling) noise to be emitted by the speaker.

Generally, by monitoring the noise from the noise source 704 (using the microphone 706), anti-noise can be calculated by the controller 710 and emitted by the speaker 708 to reduce the noise.

As is known, noise-canceling techniques may include generating anti-noise which is out of phase with the noise generated by the noise source, which can theoretically cancel the noise. Alternatively, anti-noise can be generated which shifts the frequency of the noise being generated by the noise source, such as from a low frequency (such as under 1000 Hz) to a higher frequency (such as over 1000 Hz).

As is known, a second microphone (not shown) can be provided to monitor the results of noise cancellation, at a given, monitored location, and the controller can control the anti-noise which is calculated so that the noise at the monitored location can better be minimized. Such a second microphone is often referred to as "error microphone". One of ordinary skill in the art will recognize this as a control (or feedback) loop situation where a signal is calculated to effect a desired result, the result is monitored, and any deviations from the desired result are taken into account in recalculating the signal so as to better effect the desired result.

Optionally, the controller 710 may also be used to control other instrumentalities which control the temperature and the pressure of the unit.

The Acoustic Noise Control (ANC) system may include an input transducer and an output actuator that are preferably physically located in unitary position, or at least, next to each other in the same location. In one embodiment, the input transducer and the output actuator are a hybrid represented by a single element. The active noise reduction system may be located as close as possible to the noise source as possible and functions to generate the cancellation sound wave with minimum delay with respect to the noise source(s) and minimum reflection or distortion of the noise waveform(s).

The active noise control system, when located very close to the noise source(s), functions to generate synthetic sound waves having a phase preferably opposite that of the noise. Both the noise source and the active noise control system might be situated within an enclosure or may be situated external to an enclosure. In one embodiment, the noise sound wave and the cancellation sound wave spread almost from the same point producing a high amount of noise cancellation. The output power of the cancellation signal is chosen so as to achieve maximum cancellation of the noise sound.

The acoustic cancellation method implemented by the controller may be based on the behavior of acoustic beam patterns in air or other fluids. Cancellation of the noise is achieved in an area far from the noise source while in an area relatively close to the noise source there may be pockets of noise that exist. The length of the quiet zone, as measured from the noise source, is determined by the power of the cancellation signal generated and output by the system. Since the output acoustic beam pattern is dependent on the characteristics of the output actuator and on the main cancellation frequency that is used, the type of output actuator or the angle between a plurality of actuators may need to be varied in order to achieve optimum results for different noise frequencies. The noise reduction method may be capable of achieving effective cancellation of the noise when the surface of the noise source is complex given that the distance from the noise source to the point of cancellation is bigger then the length of the noise source itself.

In addition to sensing sound from the noise source, the system also may detect the sound from the output actuator. The portion of the input signal that is due to the output actuator is removed as by using an echo cancellation technique If the output and input transducers are acoustically separate elements and there exists acoustic delayed feedback in the system, then using an echo cancellation system may be preferred. Another advantage of the echo cancellation system is the elimination of feedback sound emanating from walls, furniture, etc. and sensed by the input transducer If there is no delayed time feedback from the output transducer to the input transducer and a directional input transducer is used, then a computation may be performed on the input signal, instead of using an echo cancellation system, to discern the actual noise signal from the input signal.

In addition, the cancellation signal (destructive noise) generated by the output actuator may be reflected from the noise source itself thus adding to the amount of noise present. In order to eliminate this type of noise, a delayed cancellation signal is generated by the system. The delay and phase shift applied to the cancellation signal may be matched to the delay and phase shift associated with the reflection and feedback of the sound from the output actuator.

Figure 8:
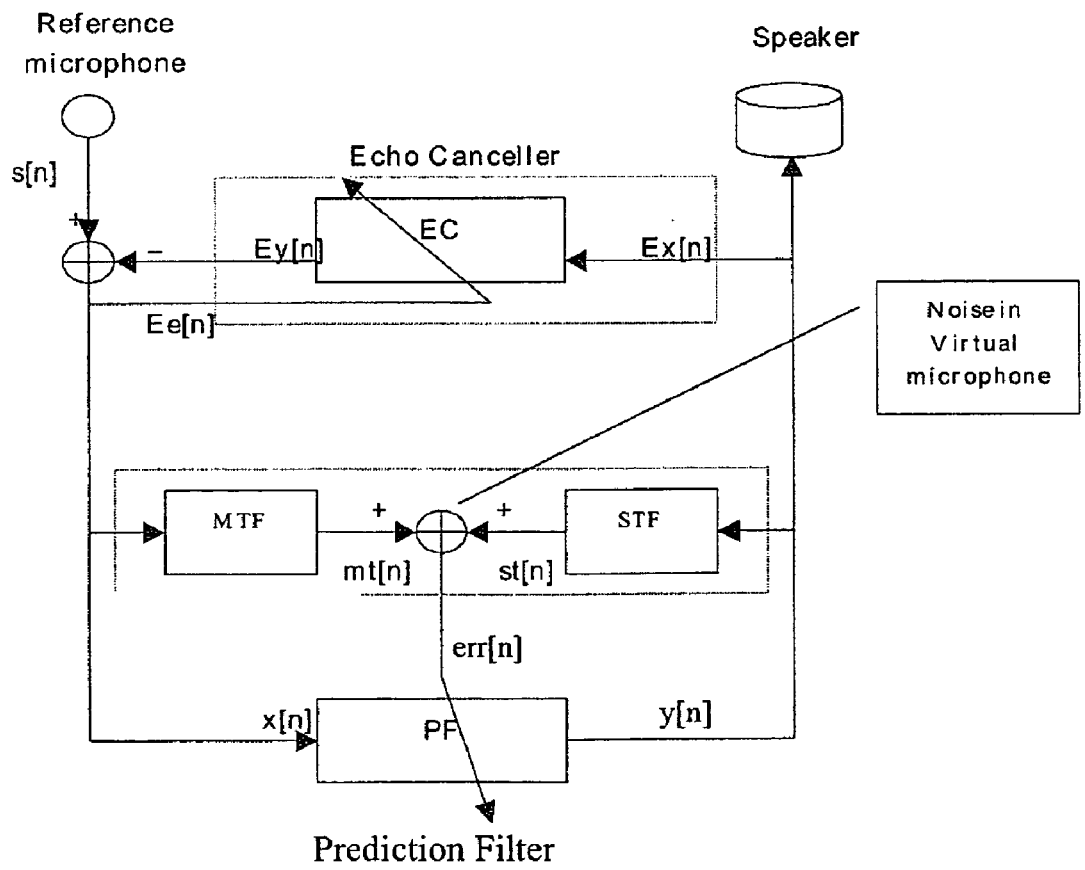
FIG. 8 is a block diagram of an ANC controller, generally, such as for the ANC system of FIG. 7.

Reference is now made to FIG. 8 which illustrates an ANC controller suitable for the ANC system of FIG. 7, generally.

The abbreviations used herein are short for:

EC, echo cancellation

PF, prediction filter

MTF, reference microphone to error microphone transfer function

STF, speaker to error microphone transfer function

There is therefore provided an acoustic noise control (ANC) system for reducing the effects of a noise source, including input transducer means for sensing the acoustic noise field generated by the noise source and for generating an input signal therefrom, output actuator means for generating an acoustic output field that is effective to reduce the level of the acoustic noise field, correction means for adjusting the input signal generated by the input transducer to compensate for the nonlinear characteristics of the input transducer and output actuator, echo cancellation means for removing from the input signal a portion of the output of the output actuator means feedback through the input transducer means, the output of the echo cancellation means representing a signal preferably corresponding to substantially the noise source by itself, anti-noise means for generating an anti-noise signal opposite in phase to the input signal, the output actuator means generating the acoustic output field from the anti-noise signal and wherein the input transducer means may be located in relatively close proximity to the output actuator means.

Figure 2:
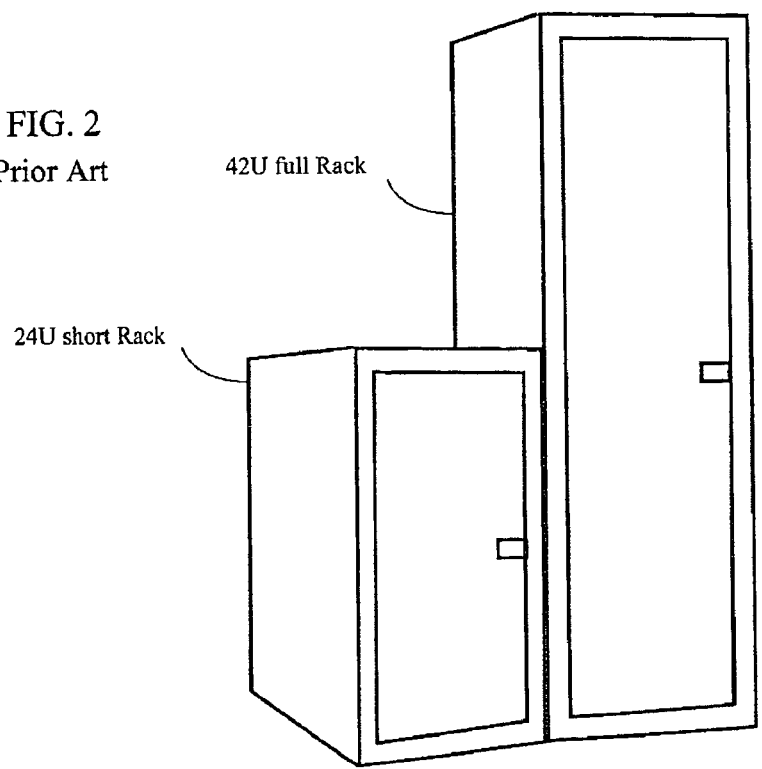
FIG. 2 is a diagram illustrating a 24 U short rack and a 42 U full rack, according to the prior art.
Figure 3:
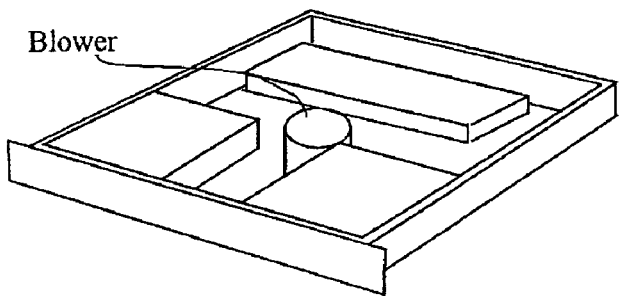
FIG. 3 is a diagram illustrating a 1 U dense server with a cooling blower at the middle of the unit, according to the prior art.

The echo cancellation means (Echo Canceller, EC, FIG. 2) may include a digital filter having a delay line with a number of taps whose total delay time is equivalent to at least a system time delay of the noise reduction system, adaptation means for dynamically adjusting the coefficient values associated with each of the taps of the digital filter and summing means for adding the output of the digital filter with the output of the correction means.

The antinoise means comprises the speaker and may include a variable gain amplifier which is located on the electronic board and which is operative to generate an amplified signal 180 degrees opposite in phase from the input signal and gain control means for dynamically controlling the gain of the variable gain amplifier. The gain control means is adapted to receive a manual input control signal from a user which determines the gain of the variable gain amplifier, the user able to vary the location of a quiet zone generated by the system by varying the input control signal. The input control signal is generated by the user remotely from the system and transmitted to the system via wireless communication means.

The system may further include a low pass filter which is located on the electronic board operative to reduce oscillations present in the system derived from feedback of the acoustic output field to the input transducer. Also, the system may further include delay cancellation means as part of the algorithm executed by the controller for reducing the effect of echo signals caused by the anti-noise means sensed by the input transducer. The delay cancellation means may include a plurality of delay cancellation circuits wherein one or more or each delay cancellation circuit is operative to reduce the effect of the echo caused by previous delay cancellation circuits.

A method for reducing the effects of a noise source may include of sensing the acoustic noise field generated by the noise source and for generating an input signal therefrom, generating an acoustic output field that is effective to reduce the level of the acoustic noise field, adjusting the input signal generated by an input transducer to compensate for any non-linear characteristics of the input transducer, removing extraneous signals from the input signal so as to generate a signal corresponding to substantially the noise source alone and generating an anti-noise signal opposite in phase to the input signal, the output actuator means generating the acoustic output field from the anti-noise signal.

The Fans (626):

The fans may serve as airflow generator device(s), which enforce or support the necessary heat dissipation capability. The fans may be mounted lengthwise of the duct as well as at the beginning of the duct. This is determined by the distribution of the heat sources in the rack. As a rule of thumb, a fan should be mounted or focused against or towards any major heat source.

In any duct there should be one or more fans and/or blowers (for example, Sanyo Denki—San Ace 200 mm or EBM R4E355AN). The fans may push air when the duct serves as an air outlet or pull the air when the duct serves as an air inlet. The fans may or may not be combined with a current regulator or the like, which enables the control system to control the fans' velocity.

The fan(s) should be mounted on shock absorber(s) such that its eigen (intrinsic) frequencies will not be passed to the soundproof panel and produce noise.

Acoustic Absorbing Material:

The acoustic absorbing material, may serve as a passive noise reduction element. This material may be sponge, acoustic compound material, rock wool, mineral wool or any other known or developed acoustic absorbing material. The acoustic absorbing material may be secured, such as glued, to the interior surfaces of the duct. The acoustic absorbing material together with the duct shape acts to depress the high frequencies noise emitted trough the airflow path (either shifting the frequency to lower wavelength or suppressing/reducing the energy of such high frequency noise).

The Control System (636):

The control system may be adapted to control the fans' velocity according to the temperature and/or the pressure values in the rack. The control system may sense the temperature and the pressure as via dedicated sensors, and may accelerate or decelerate the fans' velocity to achieve given values of the pressure and the temperature inside the rack. This control system may yield power saving and long-term operation.

In addition the system may be adapted to drive or trigger an alarm device when a fan fault is discovered for the sake of preventing damage to the interior devices. The fan fault is discovered as via the noise which may be sensed by a microphone such as one in the ANC system. When noise is below a given value at a given narrow frequencies band, which may depend upon the eigen (intrinsic) frequencies of the fan, the control system may be adapted to trigger an alarm.

The Channel/Duct (640)

The channel (or duct) 640 may provide the following:

1. Maintaining the system parts at their exact place for example, the speaker, the microphone and/or the acoustic passive materials
2. Serving as another layer of acoustic barrier: Since a significant part of the noise energy is emitted through the rack panels, the location of the duct onto the soundproof climatic controlled panel(s) may enhance blocking of acoustic energy by the panel. In addition to the thickening of the panel, which is also contributing to the isolation ability, and the construction of the duct with at least two sides perpendicularly to the panel surface may restrain the vibrations of the soundproof panel and thereby may block the sound energy which is emitted as vibrations of the panel.
3. Serving as an acoustic muffler: The length of the duct and its cross-section area may be designed to serve as an acoustic low-pass filter and to reduce the high-frequencies noise, which is accompanied to the airflow. The break frequency of the filter should comply with the ANC demands on one hand, and to avoid generation parasitic noise which stems, for example, from the air rush through unfitted duct(s) cross-section on the other hand.
4. Merging the noise from the interior parts: The ANC system should deal at least with the low-frequencies noise emitted from the rack through the airflow path. This noise cannot be treated effectively via conventional passive means, since conventional methods (such as sound absorbing materials, discussed hereinabove) usually dramatically inhibit, limit or eviscerate the heat dissipation capability. The low frequency noise is combined with the interior devices noise (for example, blade servers, dense servers, power supplies) and the auxiliary fans noise. To better treat this noise by an ANC system, the noise may be merged to produce a significant coherence of the noise between any two consequent points. The configuration of the duct may be designed to serve this aim.

5. Shaping the sound field: ANC systems may work better when the noise to be cancelled is emitted as a surface wave acoustic field. Since the original noise field is not as required, the duct is configured to shape the noise field to fulfil the ANC system demands.

In the example of FIG. 6, the duct 640 extends the entire height of the rack 600, from top to bottom (as viewed), but may extend only partially along the width (from side-to-side, into the page, as viewed) of the back panel of the cabinet 600.

A number of ducts can be disposed in the panel. The number of the ducts, their dimensions and shapes may be designated or derived from the rack inner configuration, the characteristics of the noise and other parameters.

Examples of Ducts

Figure 9:
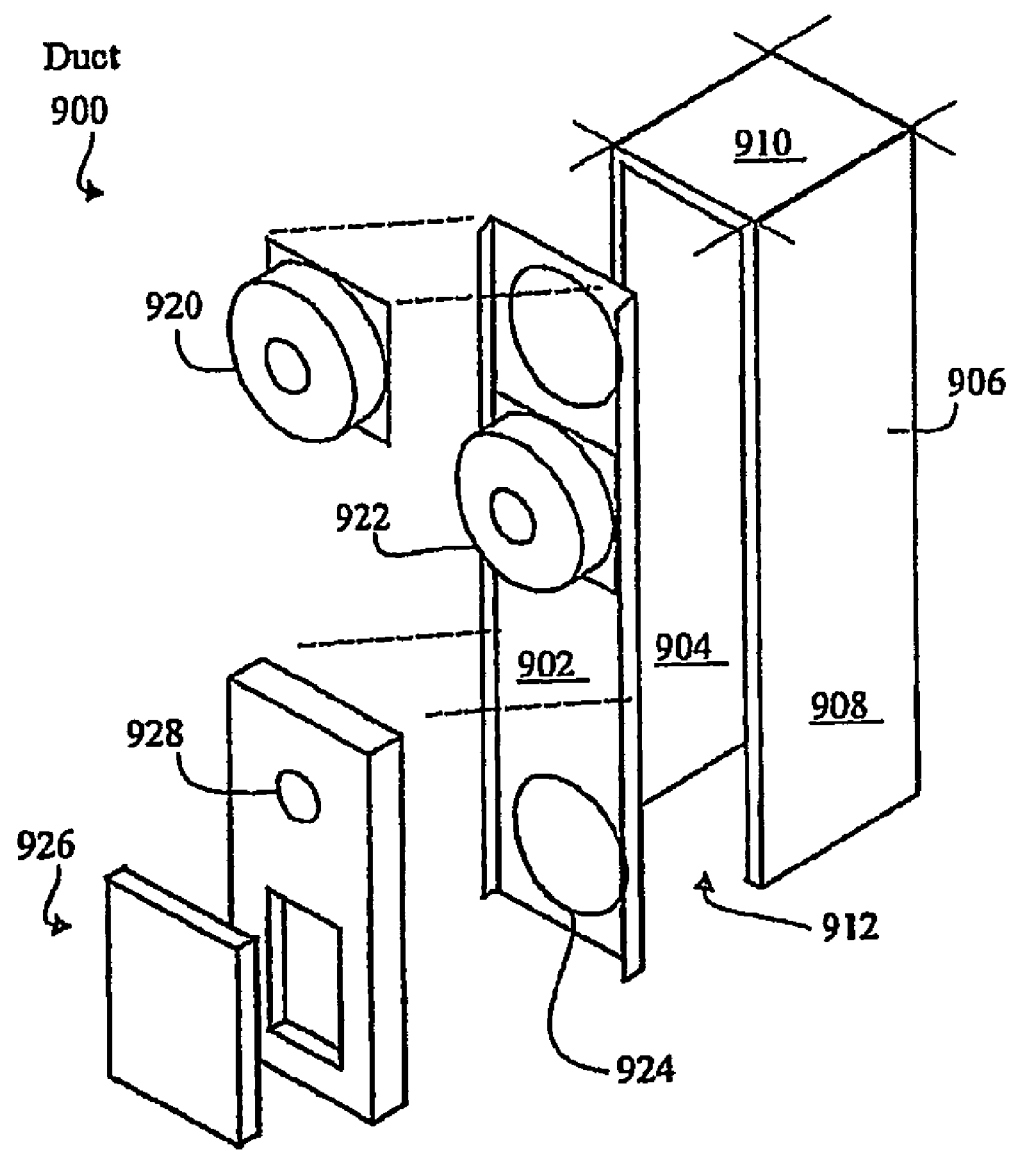
FIG. 9 is a diagram illustrating an example of a duct mounting.

FIG. 9 is an exploded view of an exemplary duct 900 with two fans 920, 922, one speaker 926, and one microphone 928. The microphone, or microphones, may be located external to the duct.

The duct 900 comprises a generally rectangular box having four sidewalls 902, 904, 906, 908, a closed end 910, and an open end 912. The sidewall 902 of the duct 900 is shown exploded away from the remaining three walls 904, 906, 908.

Fans 920, 922 (auxiliary fans) are mounted on the wall 902 of the duct 900. The sidewall 902 is also provided with a speaker hole 924. A speaker, mounted in a speaker chamber 926, is mounted on an external surface of the one wall, and directs sound through the speaker hole, into the duct, for ANC.

Figure 10:
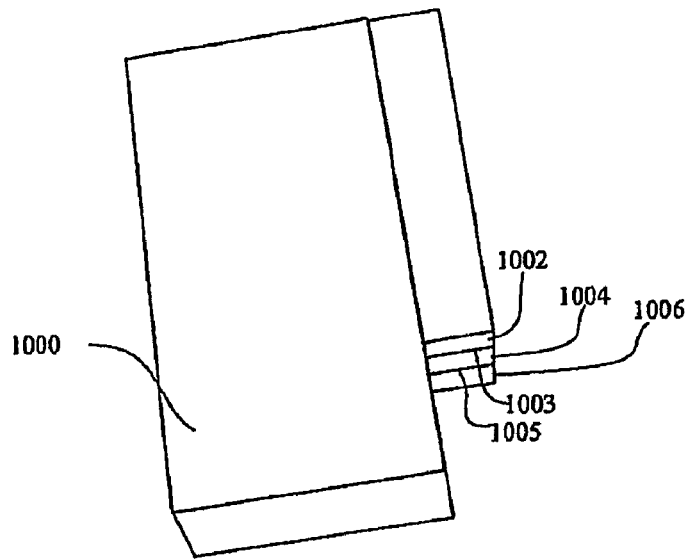
FIG. 10 is a diagram illustrating three ducts soundproof climatic controlled panels installed on a rack.

The duct 900, or a number of ducts 900 may be mounted to the rear panel (622) of a rack (600), as illustrated in FIG. 10.

FIG. 10 illustrates three ducts 1002, 1004, 1006, such as the duct 900, installed on a back panel of a rack 1000. The ducts 1002, 1004 and 1006 may be separated from one another by partitions 1003 and 1005, respectively. Inlet and outlet openings are omitted, for illustrative clarity. This figure is intended to demonstrate that multiple ducts can be installed on the back panel of a rack, and they need not extend completely from the top to the bottom of the rack (as was the case in the illustration of FIG. 6).

In an embodiment, three ducts may be installed in a "drawer-like" manner, sliding in (for installation) and out (for removal, perhaps for maintenance) of corresponding openings in a surface of a rack. This embodiment may include a rack with 2 drawer-like cooling units (on the top and the bottom of the rack) with 3 ducts in each unit. Each unit comprises a fan and an ANC system, as described above.

A method of soundproofing a rack comprises: installing at least one duct inside the rack with a sort of contact to (in fluid communication with) one or more of the rack panels in such a way that air can flow outside from the rack; causing air to flow from the rack through the duct; and providing an active noise control (ANC) system at least partially within the duct.

A soundproof, climate-controlled rack comprises: a drawer-like unit comprises one or more ducts which may be installed in the rack as any other device, basically as the upper device and/or the lower device, with a sort of contact to (in fluid communication with) one or more external panels; means for causing air to flow from the rack through the duct; and an active noise control (ANC) system disposed at least partially in the duct.

There has thus been shown, in the various embodiments presented herein, techniques for soundproofing a rack by installing at least one duct on at least one panel of the rack, or as part of the side panels of the rack (for example, two ducts as part of the front panel for air inlet and two ducts as part of the back panel for air outlet), or is mounted inside the rack as a drawer with a sort of contact to one or more of the rack panels in such a way that air can flow outside from the rack causing air to flow from the rack through the duct, and providing an active noise control (ANC) system within the duct. Passive noise control may also be provided in the duct. At least one fan may be provided at an inlet of the duct. Fan speed may be controlled, in response to a climactic condition within the rack. The duct may comprise a back panel which is added on or a replacement for an existing back panel of the rack. A muffled inlet may be provided on another external surface of the rack.

Operation of the Soundproof Climatic Controlled Panel

There is also provided a method for reducing the effects of a noise source and for controlling the climate at a predefined space (such as a rack, closet, cabinet or any other storage means for computer(s) or other related equipment) which method may include generating an input signal from a sensed acoustic noise field generated by a noise source, generating an acoustic output field that is effective to reduce the level of the acoustic noise field, adjusting the input signal generated by an input transducer to compensate for the non linear characteristics of the input transducer, removing extraneous signals from the input signal so as to generate a signal corresponding to substantially the noise source alone and generating an antinoise signal opposite in phase to the input signal, the output actuator means generating the acoustic output field from the antinoise signal. The method may further provide computing a fan speed according to a measured temperature level and setting the fans.

Controlling the climate may be performed for example using controllable fan operation regarding temperature, pressure, fan failures and humidity. Reducing the effects of a noise source may include any method or combination of methods disclosed herein and/or known to a person of a skill in art. The various methods may be performed as by a microprocessor, microcontroller or the like associated with the equipment.

Reducing Noise

Figure 12:
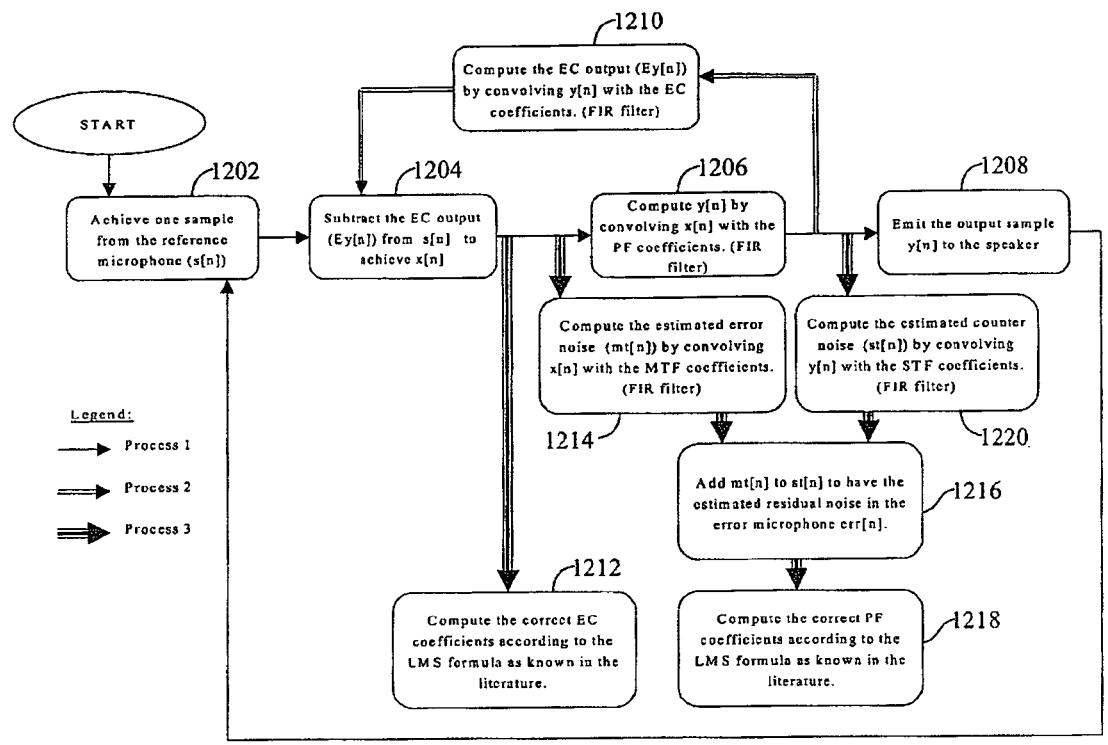
FIG. 12 is a flow chart of a method for reducing the effects of a noise source, such as may be implemented in the ANC controller of FIG. 8.

FIG. 12 illustrates a method for reducing the effects of a noise source. Three processes are illustrated, and are referred to as "Process 1", "Process 2", and "Process 3".

In a first step 1202, achieve (acquire) one sample from the reference microphone (s[n]).

In a next step 1204, subtract the EC output [Ey[n] from s[n] to achieve x[n].

The first two steps 1202 and 1204 are common to all three processes (Process 1, Process 2, Process 3).

Next, in Process 1, in a step 1206, compute y[n] by convolving x[n] with the PF coefficients (FIR filter).

Next, in Process 1, in a step 1208, emit the output sample y[n] to the speaker.

Next, in Process 1, loop back to the step 1202 to achieve another sample from the reference microphone.

After the step 1206, in Process 2, in a step 1210, compute the EC output (Ey[n]) by convolving y[n] with the EC coefficients (FIR filter), and provide the result to step 1204, as shown. The purpose of this step is to estimate and to subtract the destructive noise that is sensed by the reference microphone as a surplus signal. The optimal situation is that the reference microphone senses the source signal only, but the real situation is sensing the destructive signal from the speaker also.

Process 3 is different than either of Process 1 or Process 2 in that it does not loop back.

In Process 3, after the step 1204, in a step 1212, compute the correct EC coefficients according to the LMS formula, as known in the literature. The purpose of this step is to Track changes in time in the transfer function of the speaker and of the space between the speaker and the reference microphone.

In Process 3, also after the step 1204, in a step 1214, compute the estimated error noise (mt[n]) by convolving x[n] with the MTF coefficients (FIR filter). Then, in a step 1216, add mt[n] to st[n] to have the estimated residual noise in the error microphone err[n]. Then, in a step 1218, compute the correct PF coefficients according to the LMS formula, as known in the literature. The purpose of these steps is to Track changes in time in the noise signal characteristic and hence to adjust the required destructive noise.

In Process 3, after the step 1206, in a step 1220, compute the estimated counter noise (st[n]) by convolving s[n] with the STF coefficients (FIR filter). Then, perform the step 1216, as already described. The purpose of these steps is to compute the correction of the PF coefficients as per the well known in the literature XLMS algorithm.

Climate Control

Figure 11:
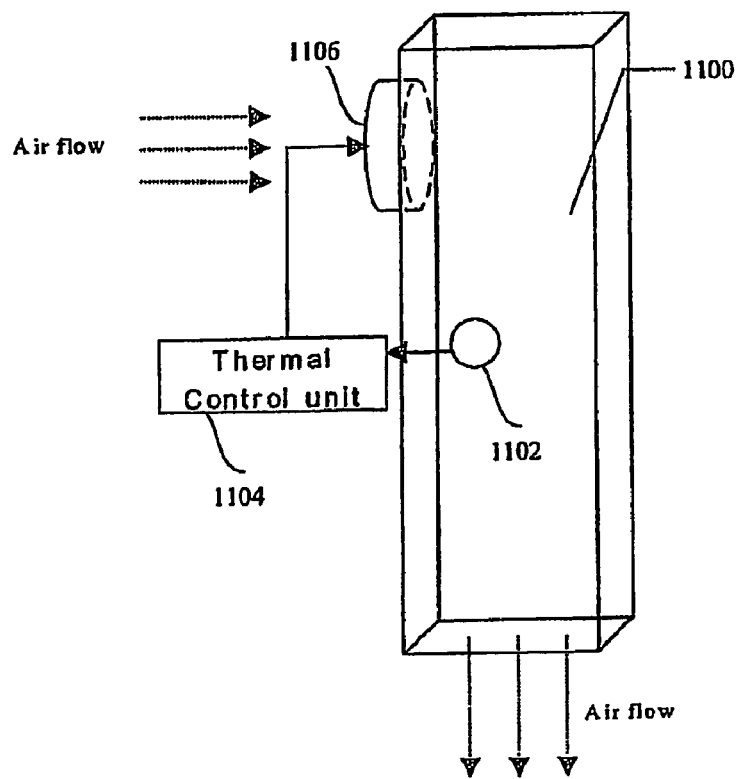
FIG. 11 is a diagram illustrating a thermal control unit, incorporated into a duct.

FIG. 11 illustrates a thermal control unit. A thermostat 1102 may be provided in the duct 1100, and a thermal control unit 1104 may be used to control the speed of a fan/blower 1106, to regulate air temperature. The duct 1100 may be similar to the ducts 624, 900, 1002, 1004, 1006 described hereinabove. The thermal control unit 1104 may be integrated in the control system 636.

Figure 13:
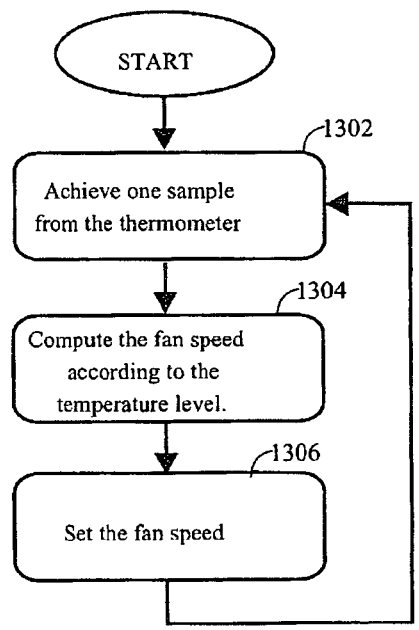
FIG. 13 is a flow chart of a method for thermal control.

FIG. 13 is a flow chart of a method for thermal control. A signal is acquired (step 1302) from the thermostat 1102 which is indicative of the temperature within the cabinet (such as 600). An appropriate speed for the fan 1106 is computed (step 1304) according to the temperature level, and it is set (step 1306). The fan speed is controlled in response to a climactic condition within the rack—in this example, temperature.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A method of soundproofing a rack, the method comprising:
    installing a first duct at an inlet panel of the rack;
    installing a second duct at an outlet panel of the rack;
    causing air to flow through the rack in a labyrinth manner from the first duct to the second duct; and
    providing an active noise control (ANC) system at least partially within at least one of the first and second ducts,
    wherein the ANC system is to actively reduce one or more effects of a noise generated by a noise source,
    wherein the ANC system comprises:
        an input transducer to sense an acoustic noise field generated by the noise source, and to generate an input signal corresponding to the acoustic noise field;
        an output actuator to generate an acoustic output field effective to reduce a level of the acoustic noise field;
        a correction unit to adjust the input signal to compensate for characteristics of the input transducer and the output actuator;
        an echo cancellation unit to remove from the input signal a portion of the output of the output actuator, which comprises a feedback through the input transducer, wherein an output of the echo cancellation unit represents a signal corresponding to the noise source; and
        an anti-noise generator to generate an anti-noise signal opposite in phase to the input signal,
    wherein the output actuator is to generate the acoustic output field based on the anti-noise signal.

2. The method of claim 1, further comprising:
    providing passive noise control in the second duct.

3. The method of claim 1, further comprising:
    providing at least one fan at an entrance of the second duct to assist in pulling air from the first duct to the second duct.

4. The method of claim 3, further comprising:
    controlling a speed of the at least one fan.

5. The method of claim 4, wherein controlling the speed comprises:
    controlling the speed of the at least one fan in response to a climactic condition within the rack.

6. The method of claim 1, wherein the second duct comprises a back panel which is added on or a replacement for an existing back panel of the rack.

7. The method of claim 1, wherein the active noise control (ANC) system is adapted to actively reduce noise above 1000 Hz.

8. A soundproof climate controlled rack comprising:
    a first duct installed at an inlet area of the rack;
    a second duct installed at an outlet area of the rack, wherein air is to flow through the rack in a labyrinth manner from the first duct to the second duct; and
    an active noise control (ANC) system disposed at least partially in at least one of the first and second ducts,
    wherein the ANC system is to actively reduce one or more effects of a noise generated by a noise source,
    wherein the ANC system comprises:
        an input transducer to sense an acoustic noise field generated by the noise source, and to generate an input signal corresponding to the acoustic noise field;
        an output actuator to generate an acoustic output field effective to reduce a level of the acoustic noise field;
        a correction unit to adjust the input signal to compensate for characteristics of the input transducer and the output actuator;
        an echo cancellation unit to remove from the input signal a portion of the output of the output actuator, which comprises a feedback through the input transducer, wherein an output of the echo cancellation unit represents a signal corresponding to the noise source; and
        an anti-noise generator to generate an anti-noise signal opposite in phase to the input signal,
    wherein the output actuator is to generate the acoustic output field based on the anti-noise signal.

9. The soundproof, climate-controlled rack of claim 8, wherein the means for causing air to flow comprises at least one fan.

10. The soundproof, climate-controlled rack of claim 8, further comprising:
    means for controlling a speed of the at least one fan in response to a climactic condition within the rack.

11. The soundproof, climate-controlled rack of claim 8, wherein the external surface comprises a back panel of the rack.

12. The soundproof, climate-controlled rack of claim 8, wherein the first duct comprises a muffled inlet.

13. The soundproof, climate-controlled rack of claim 8, wherein the second duct is generally rectangular prismatic shaped having six sides, having an inlet opening at one end, and having an outlet opening at an opposite end.

14. The soundproof, climate-controlled rack of claim 8, wherein the second duct comprises a drawer-like unit able to be slid-into and slid-out of a corresponding opening of said external surface of the rack.

15. The soundproof, climate-controlled rack of claim 8, wherein said means for causing air to flow comprises an airflow generator selected from a group consisting of a fan and a blower.

16. The soundproof, climate-controlled rack of claim 15, further comprising a control system adapted to control a velocity of said airflow generator responsive to a temperature within said rack.

17. The soundproof, climate-controlled rack of claim 15, wherein the second duct is installed as a drawer-like unit within said rack.

18. The soundproof, climate-controlled rack of claim 8, wherein the active noise control (ANC) system is adapted to actively reduce noise above 1000 Hz.

* * * * *